(12) United States Patent
Burke et al.

(10) Patent No.: US 8,945,502 B2
(45) Date of Patent: Feb. 3, 2015

(54) PATTERNED, DENSE AND HIGH-QUALITY SWNTS ARRAYS

(75) Inventors: Peter J. Burke, Irvine, CA (US); Weiwei Zhou, Durham, NC (US); Christopher M. Rutherglen, Tustin, CA (US)

(73) Assignee: The Regents of the University of California, Oakland, CA (US)

(*) Notice: Subject to any disclaimer, the term of this patent is extended or adjusted under 35 U.S.C. 154(b) by 614 days.

(21) Appl. No.: 12/429,595

(22) Filed: Apr. 24, 2009

(65) Prior Publication Data

US 2009/0286066 A1 Nov. 19, 2009

Related U.S. Application Data

(60) Provisional application No. 61/049,051, filed on Apr. 30, 2008.

(51) Int. Cl.

| | |
|---|---|
| *D01F 9/12* | (2006.01) |
| *D01F 9/127* | (2006.01) |
| *H01L 51/00* | (2006.01) |
| *B82Y 10/00* | (2011.01) |
| *B82Y 30/00* | (2011.01) |
| *B82Y 40/00* | (2011.01) |
| *C01B 31/02* | (2006.01) |
| *H01L 51/05* | (2006.01) |

(52) U.S. Cl.
CPC ............ *H01L 51/0002* (2013.01); *B82Y 10/00* (2013.01); *B82Y 30/00* (2013.01); *B82Y 40/00* (2013.01); *C01B 31/0233* (2013.01); *C01B 2202/02* (2013.01); *C01B 2202/08* (2013.01); *C01B 2202/36* (2013.01); *H01L 51/0048* (2013.01); *H01L 51/0541* (2013.01); *Y10S 977/843* (2013.01)
USPC ...................................... 423/447.3; 977/843

(58) Field of Classification Search
USPC ........ 423/447.1–447.3, 445 B; 977/742–754, 977/842–848; 430/311–331
See application file for complete search history.

(56) References Cited

U.S. PATENT DOCUMENTS

| | | | | |
|---|---|---|---|---|
| 5,817,242 | A | * 10/1998 | Biebuyck et al. | ............... 216/41 |
| 2004/0101469 | A1 | * 5/2004 | Demers | ...................... 423/447.3 |
| 2008/0175786 | A1 | * 7/2008 | Zhang et al. | ............... 423/447.3 |

OTHER PUBLICATIONS

Hata, et al., Water-Assisted Highly Efficient Synthesis of Impurity-Free Single-Walled Carbon Nanotubes, Science 2004; 306:1362-1364.*
Li, et al., Carbon Nanotube Growth for GHz Devices, IEEE-NANO 2003; 2:256-258.*
Zhou, et al., Wafer Scale Synthesis of Dense Aligned Arrays of Single-Walled Carbon Nanotubes, Nano. Res. 2008; 1: 159-165.*

(Continued)

*Primary Examiner* — Daniel C McCracken
(74) *Attorney, Agent, or Firm* — One LLP

(57) ABSTRACT

An electronics component is disclosed herein. The electronics component include a substrate and a plurality of single-walled carbon nanotubes (SWNTs) formed on said substrate, wherein said plurality of SWNTs form a patterned, dense and high-quality arrays of single-walled carbon nanotubes (SWNTs) on quartz wafers by using FeCl$_3$/polymer as catalytic precursors and chemical vapor deposition (CVD) of methane. With the assistance of polymer, the catalysts may be well-patterned on the wafer surface by simple photolithography or polydimethylsiloxane (PDMS) stamp microcontact printing (μCP).

13 Claims, 7 Drawing Sheets

(56) References Cited

OTHER PUBLICATIONS

Kocabas et al., *Improved Synthesis of Aligned Arrays of Single-Walled Carbon Nanotubes and Their Implementation in Thin Film Type Transistors*, J. Phys. Chem. C 2007, 111, No. 48, pp. 17879-17886.

Kocabas et al., "*Radio frequency analog electronics based on carbon nanotube transistors*", Applied Physical Sciences (Feb. 5, 2008), vol. 105, No. 5, pp. 1405-1409.

Zhou et al., "*Wafer Scale of Dense Aligned Arrays of Single-Walled Carbon Nanotubes*", Nano Res (2008) vol. 1, pp. 158-165.

Kang et al., "*High-performance electronics using dense, perfectly aligned arrays of single-walled carbon nanotubes*", Nat. Nanotechnol. 2007, vol. 2, pp. 230-236.

Ding et al., "*Growth of High-Density Parallel Arrays of Long Single-Walled Carbon Nanotubes on Quartz Substrates*", J. Am. Chem. Soc. (2008), pp. 5428-5429.

\* cited by examiner

PATTERNED, DENSE AND HIGH-QUALITY SWNTS ARRAYS

CROSS-REFERENCE TO RELATED APPLICATIONS DATA

This application claims the benefit of U.S. provisional patent application No. 61/049,051, filed Apr. 30, 2008, which application is incorporated herein by reference.

GOVERNMENT LICENSE RIGHTS

The U.S. Government has a paid-up license in this invention and the right in limited circumstances to require the patent owner to license others on reasonable terms as provided for by the terms of Grant No. N00014-06-1-0268 awarded by the Office of Naval Research.

FIELD OF THE INVENTION

The present invention relates to single-wall carbon nanotubes (SWNTs) and, more particularly, to patterned, dense and high-quality SWNTs and fabrication techniques that facilitate the growth of patterned, dense and high-quality SWNTs arrays on a substrate.

BACKGROUND

Theoretical works have predicted that single-walled carbon nanotubes (SWNTs) have potential applications in high-frequency electronics. Until now, however, intensive study has been obstructed by the very weak signals of SWNTs in the microwave regime. Therefore, fabrication of aligned arrays of SWNTs with very high density is ultimately important to microwave applications of SWNTs. Basic nanotube transistor operations, however, has been evidenced in radio frequency analog electronics.

Fabricating a plurality of patterned SWNTs (or SWNT arrays) using conventional techniques tends not to result in very high density SWNTs and also results in imperfect array alignment, i.e., non-parallel. Moreover, conventional techniques used to fabricate arrays of SWNTs by patterning catalysts tend to be difficult to use and are typically unusable on a wafer scale.

SUMMARY

The systems and methods described herein provide embodiments and examples generally directed to patterned, dense, and high-quality SWNTs and fabrication techniques that facilitate the growth of patterned, dense, and high-quality SWNTs arrays on a substrate. The processes described herein can be widely used in the synthesis of SWNTs on various substrates including quartz wafers, silicon wafers, sapphire wafers, and the like. The high-quality arrays of SWNTs with high density synthesized by the processes described herein may be implemented in high-frequency electronics and highly integrated circuits.

As disclosed herein, high-quality, dense SWNTs arrays may be successfully fabricated on substrates by using $FeCl_3$/polymer nanoparticles as catalytic precursors and CVD (chemical vapor deposition) of methane. Furthermore, the use of polymer nanoparticles advantageously facilitates the formation of uniform, perfect or near perfect catalyst patterns on a large scale by simple photolithography or PDMS (polydimenthylsiloxane) microcontact printing (μCP) techniques.

Multiple polymer layers may be used to both effectively attribute the formation of mono-dispersed catalyst nanoparticles and hinder them from moving together on the substrates during the CVD process. In the past, the catalyst particles were dissolved in a solvent, which when allowed to dry, tended to form small islands of solution as the solvent evaporated. This caused the catalyst particles to precipitate and form clumps, or accumulations, of particles. In the methods described herein, the catalyst particles are imbedded in a polymer and, thus, keeping them separate, i.e., dispersed. Using the $O_2$ plasma or calcinations treatment, the polymer is burned off and causes the catalyst particles to fall directly onto the substrate below without the effect of a solvent "pulling" them together.

The method disclosed facilitates the fabrication of uniform and almost perfectly aligned arrays of SWNTs synthesized with an average density of 10 SWNTs/μm per unit length, i.e., having 10 SWNTs in parallel formation with respect to each other in such close adjacent proximity that they may fit within 1 μm, and a length of up to one millimeter. The method disclosed herein also facilitates the application of arrays of SWNTs into highly integrated circuits. Increasing SWNT density enhances the electrical properties of the SWNTs by allowing for: 1) a larger current carrying capacity and, thus, larger power capability; 2) improved impedance matching of device to a value closer to 50Ω; and 3) reduction in the parasitic capacitance on a per-tube basis for devices such as, for example, a rf-field effect transistor (rf-FET).

Further objects and advantages of the invention will become apparent from the following detailed description.

DETAILED DESCRIPTION OF THE PREFERRED EMBODIMENTS

Each of the additional features and teachings disclosed below can be utilized separately or in conjunction with other features and teachings to provide improved patterned, dense, and high-quality SWNTs arrays. Representative examples of the present invention, which examples utilize many of these additional features and teachings both separately and in combination, will now be described in further detail with reference to the attached figures. This detailed description is merely intended to teach a person of skill in the art further details for practicing preferred aspects of the present teachings and is not intended to limit the scope of the invention. Therefore, combinations of features and steps disclosed in the following detail description cannot be necessary to practice the invention in the broadest sense, and are instead taught merely to particularly describe representative examples of the present teachings.

Moreover, the various features of the representative examples and the dependent claims can be combined in ways that are not specifically and explicitly enumerated in order to provide additional useful embodiments of the present teachings. In addition, it is expressly noted that all features disclosed in the description and/or the claims are intended to be disclosed separately and independently from each other for the purpose of original disclosure, as well as for the purpose of restricting the claimed subject matter independent of the compositions of the features in the embodiments and/or the claims. It is also expressly noted that all value ranges or indications of groups of entities disclose every possible intermediate value or intermediate entity for the purpose of original disclosure, as well as for the purpose of restricting the claimed subject matter.

Figure 1:
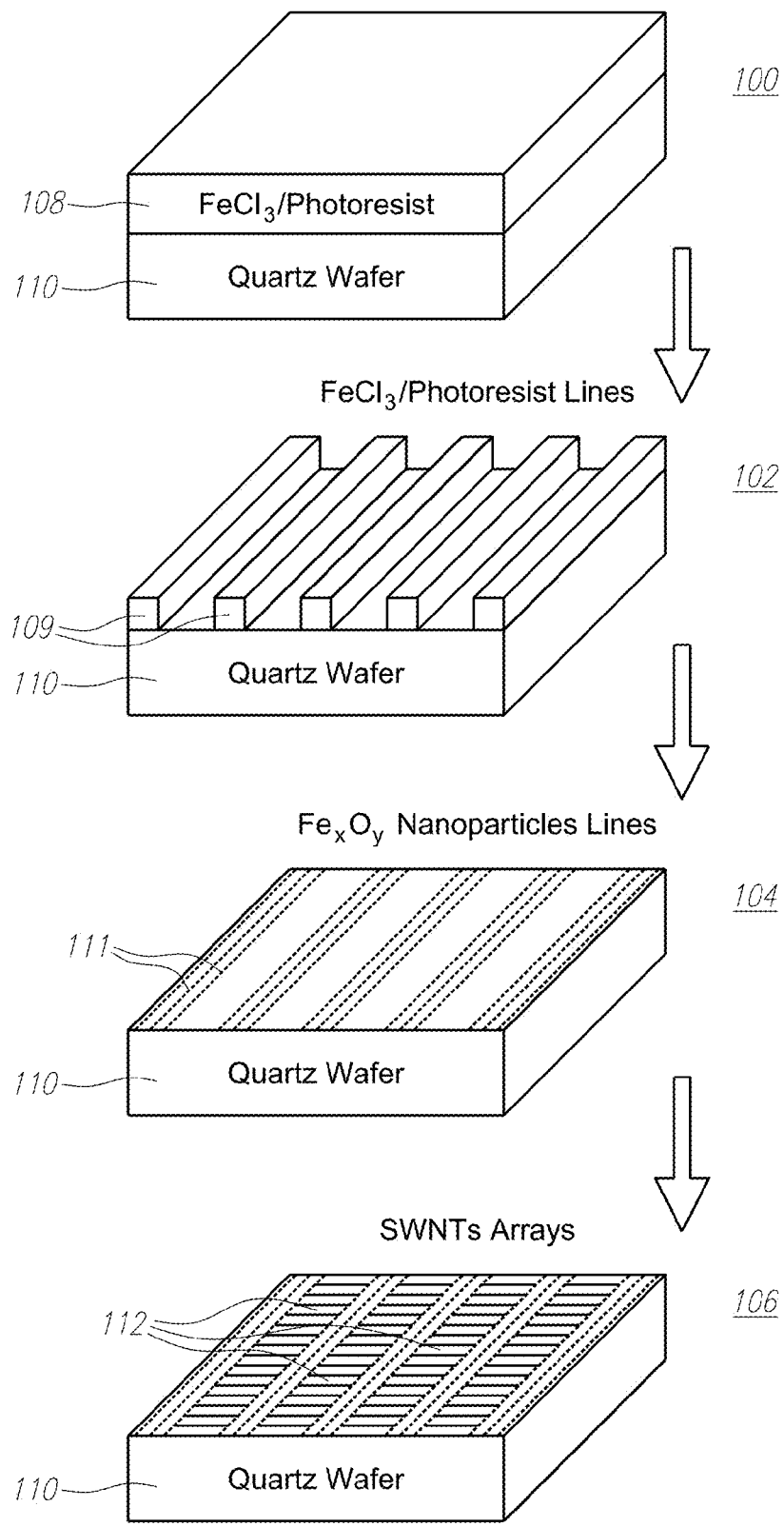
FIG. 1 illustrates a process for patterning catalyst lines by simple photolithography and the growth of arrays of SWNTs on quartz wafers.

FIG. 1 illustrates a process for patterning lines of catalyst particles by simple photolithography and the uniform growth of arrays of SWNTs on a substrate by a CVD process. At step 100, a substrate, such as, e.g., a quartz wafer 110, is depicted as having a photoresist layer 108 formed thereon. The photoresist includes particles such as $FeCl_3$ that will ultimately serve as the catalytic precursor for growth of an SWNT array. ST-cut quartz wafer 110 may be annealed at 900° C. in air for 1 hour before a standard UV photolithography process is applied. In one exemplary embodiment, the photoresist layer 108 comprises SHIPLEY 1827 positive photoresist doped with a 5 mM $FeCl_3$ methanol solution.

Through standard photolithography, illustrated by step 102, the photoresist is patterned into lines 109. The photoresist lines 109 tend to be preferably about 20 μm in width and 2 cm in length and preferably spaced from about 10 μm to 100 μm with spacing gradually changing along the wafer 110. This preliminary process will ultimately serve as the catalytic precursor for catalyzing the growth of SWNTs 112.

As an alternative to the photolithography process just described, polydimenthylsiloxane (PDMS) stamp microcontact printing (μCP), also known as soft lithography, may be used to form polymer lines containing embedded catalyst particles (not shown but similar to photoresist lines 109). In this instance, a PDMS stamp may be treated by $O_2$ plasma for 5 minutes in order to improve the hydrophilicity of a surface. An ink comprising a methanol solution of 10 mM $FeCl_3$ and PVP, with the 20 mM~40 mM concentration of monomer, is prepared and then dipped onto the surface of the stamp. After drying, the ink (not shown) is transferred onto the surface of a clean substrate without annealing by placing the stamp in direct contact with the substrate for approximately 2 minutes. The ink lines (not shown) on substrates also may be vertical to the X-axis of the substrate.

At step 104, the wafer 110 is depicted as having only lines of $Fe_xO_y$ nanoparticles 111 remaining after removal of the photoresist 109. Specifically, after the photolithography or μCP processes (previously described), the wafer 110 is treated to remove or eliminate the photoresist in lines 109 and form lines of precursor nanoparticles 111 such as, e.g., $Fe_xO_y$ nanoparticles. For example, the wafer 110 may be treated by $O_2$ plasma for 15 minutes or calcined at 700° C. in air for 5 minutes to substantially eliminate the photoresist in lines 109 and form columns of $Fe_xO_y$ nanoparticles 111.

For the case of $FeCl_3$/SHIPLEY 1827 photoresist 108 as the catalytic precursor, the wafer 110 may be put into a horizontal furnace (e.g., Lindberg 3" diameter Tube Furnace (not shown)) and heated, e.g., heated to 920° C. in the protection of Ar (1500 sccm). Subsequently, a flow of the $CH_4$/$H_2$ mixture gas (1100 sccm/220 sccm) may be introduced into the furnace in a direction normal to the lines of nanoparticles 111 for SWNTs 112 growth; as depicted in FIG. 1 at step 106. After approximately 30 minutes, the furnace may be cooled down to room temperature in Ar (1500 sccm).

If $FeCl_3$/PVP was used as the catalytic precursor, before the CVD growth of SWNTs 112, reduction is necessary by introducing $H_2$/Ar (220 sccm/1000 sccm) for 5-15 minutes depending on the concentration of PVP. Otherwise, the identical steps previously described in relation to $FeCl_3$/SHIPLEY 1827 photoresist 108 are equally applicable to SWNTs 112 formation. Regardless of the polymer implemented, the methods disclosed herein offer one the ability to uniformly manufacture an SWNT array onto a large substrate surface area, i.e., randomness of SWNT creation has been minimized, if not altogether eliminated.

FIG. 2a-d is a series of SEM (scanning electron microscope) images of an aligned array of SWNTs 112 grown on ST-cut quartz wafer 110 using $FeCl_3$/SHIPLEY 1827 photoresist 108 as catalytic precursors and photolithography to pattern the uniform catalyst precursor lines. Depicted are the SEM images of typical arrays of SWNTs 112 on quartz wafers 110 after using a mixture solution of 5 mM $FeCl_3$ and SHIPLEY 1827 photoresist 108 as catalytic precursors and simple photolithography to pattern the uniform catalysts lines 109. As shown, the arrays of SWNTs 112 are perfectly aligned and have a uniform density of approximately 10 SWNTs/.mu.m per unit length (i.e., measured along a line transverse to the longitudinal axis of the SWNTs) on a 25 mm.times.40mm wafer without any curved or random SWNTs 112, even though the sizes of the spacing between catalyst lines may change from 10 μm to 100 μm on wafer 110.

Figure 2:
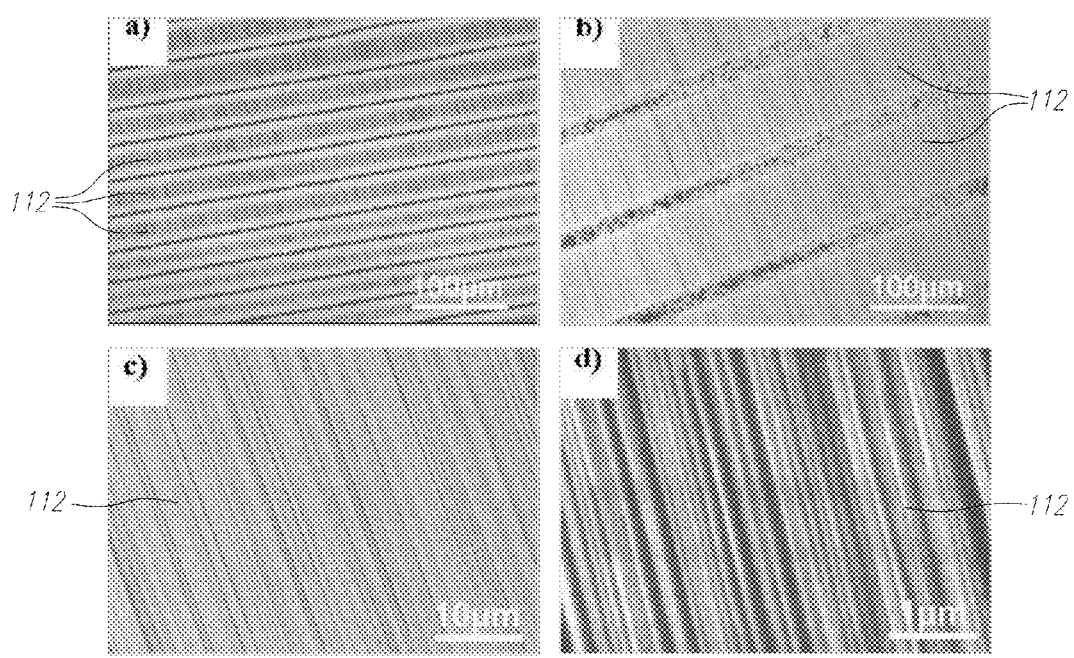
FIG. 2a-d is a series of SEM (scanning electron microscope) images of an aligned array of SWNTs grown on ST-cut quartz wafer using $FeCl_3$/SHIPLEY 1827 photoresist as catalytic precursors and photolithography to pattern the uniform catalysts lines.

The exemplary results depicted in FIG. 2 are reproducible since a standard photolithography process 102 can make sure the uniform catalyst lines 109 are well patterned in large scale. The thermal annealing for the wafers 110 in air may be necessary before photolithography because the thermal treatment at high temperature for quartz wafers 110 may greatly decrease the —OH groups on the surface and then may improve the adhesion between photoresist 108 and quartz wafers 110. Although thermal annealing for a long time at high temperature can increase the number of the atomic steps on the surface of quartz wafers 110 or sapphires, as illustrated by AFM (FIG. 3b), there are no obvious atomic steps produced on the quartz surface 110 by a 1 hour thermal treatment. This result evidences that SWNTs 112 are mainly guided by the direction of lattice, not by the atomic steps on the surface. Accordingly, it may not be necessary for thermal annealing of the quartz wafers 110 a long time prior to the CVD process 106.

Figure 3:
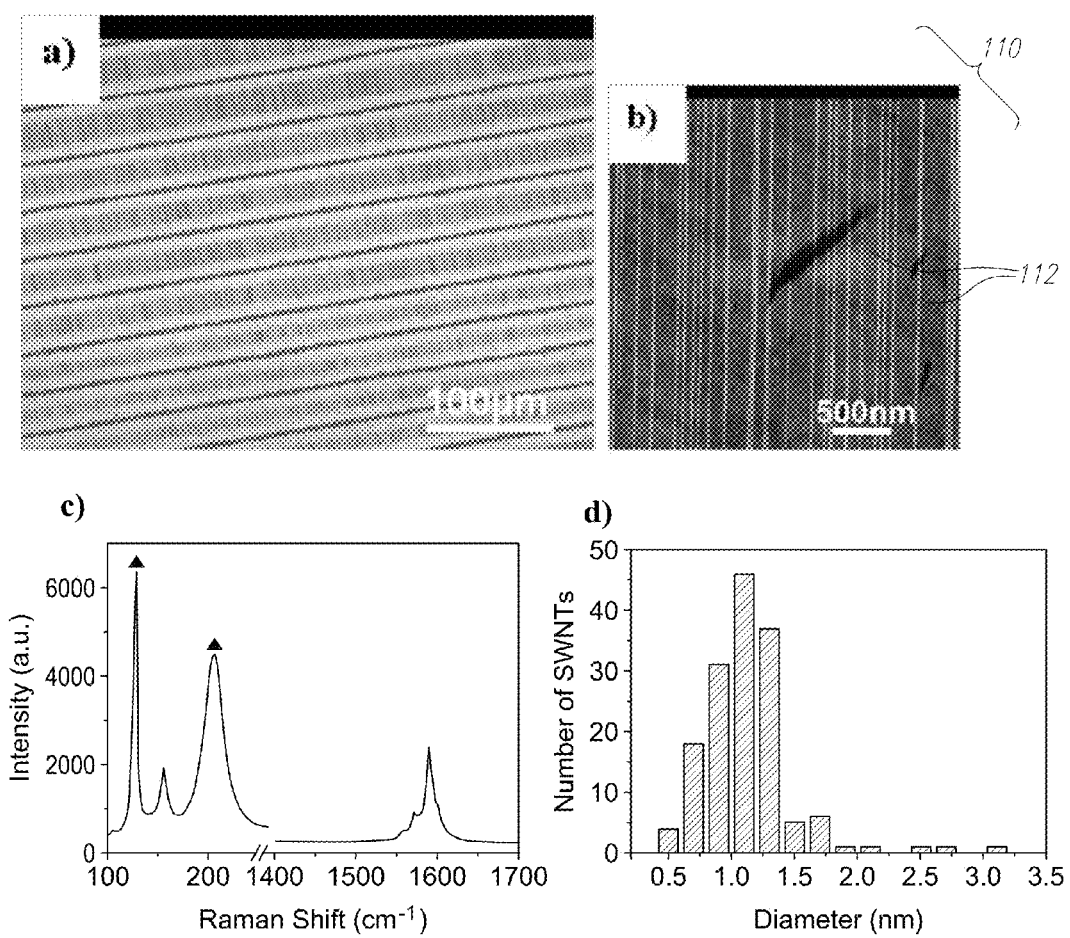
FIG. 3a-d illustrates an SEM image of SWNT arrays grown from the edges of catalysts, along with an atomic force microscope (AFM) image of same, corresponding Raman spectra and SWNT diameter chart.

FIG. 3a-d illustrates an SEM image of SWNT arrays 112 grown from the edges of catalysts, along with an atomic force microscope (AFM) image of same, corresponding Raman spectra and SWNT diameter charts. According to FIG. 3a, the lengths of most SWNTs 112 are more than 200 μm and a few of the tubes can reach up to 1 mm. By using AFM to measure 150 SWNTs 112, one of ordinary skill may calculate that the average of diameters is 1.1 nm—with 95% SWNTs falling within 0.7 nm to 1.7 nm, thus, indicating that the vast majority of tubes are individual single-walled tubes and that the arrays have very narrow distribution of diameters (FIG. 3d).

In the AFM image (FIG. 3b), there are very clean and straight SWNTs 112 on wafers 110, and no amorphous carbon or catalyst nanoparticles may be observed. Although there may be ample photoresist 108 applied to the wafer 110 in the disclosed procedure, it does not cause any contamination for wafers 110 and SWNTs 112, and further does not disturb the growth of SWNTs 112. Moreover, FIG. 3c shows a typical Raman spectrum of semiconducting tubes with a radial breathing mode (RBM) peak at 156 cm$^{-1}$. The RBM signals of metallic tubes are easily covered by the wide peak at approximately 205 cm$^{-1}$ sourced from single-crystal quartz wafers for the 633 nm excitation wavelength of laser.

FIG. 4a-f is a series of SEM images of an aligned array of SWNTs 112 grown on quartz wafers 110 by using FeCl$_3$/PVP as catalytic precursors and PDMS μCP technique to pattern the catalysts lines, along with corresponding Raman spectra chart and AFM image. As previously described, besides using the photolithography method to realize the patterned growth of arrays of SWNTs 112 on quartz wafers 110, a PDMS stamp μCP technique, with the assistance of PVP, may also be used to pattern catalyst lines 109 on quartz wafers 110.

Figure 4:
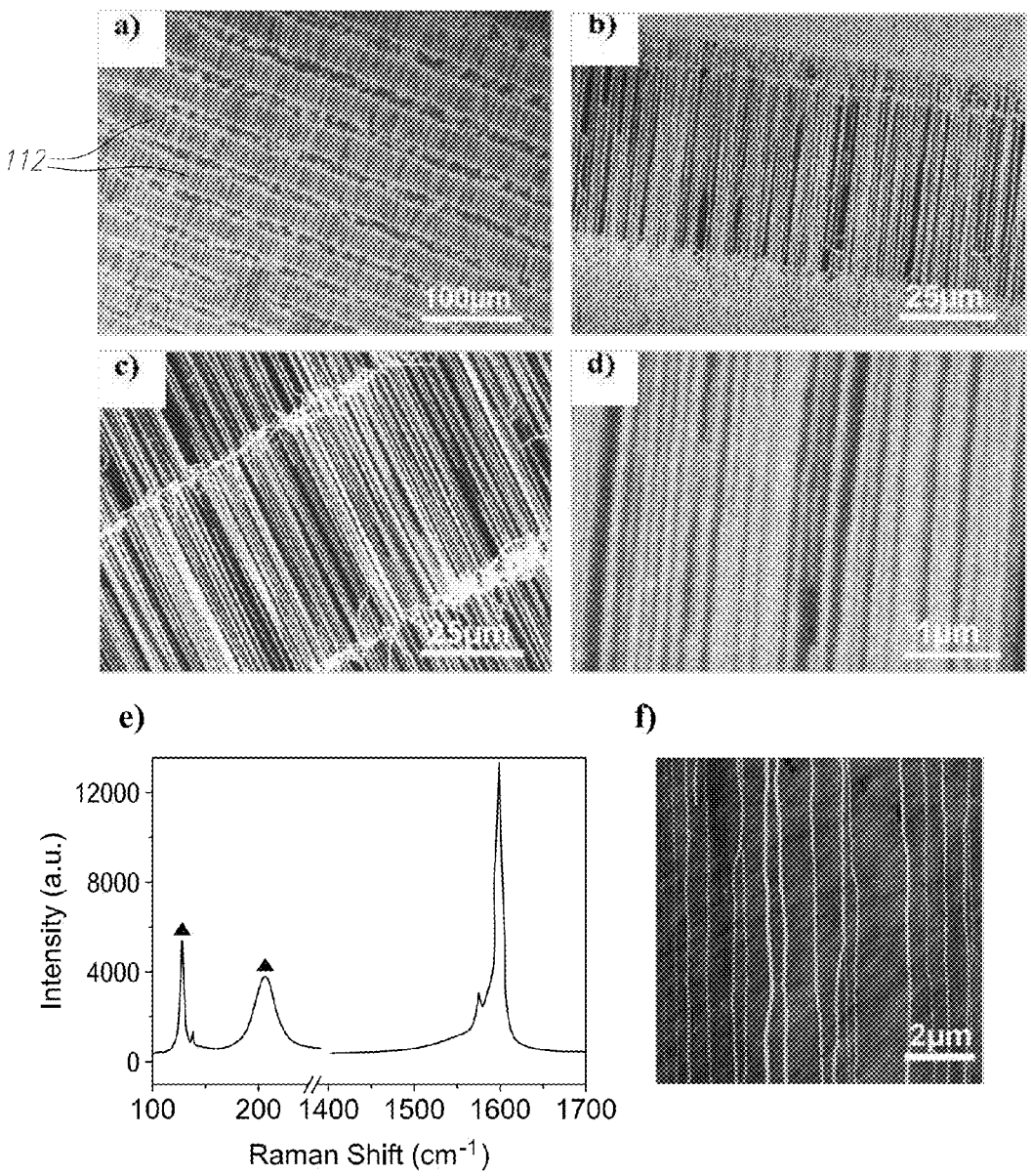
FIG. 4a-f is a series of SEM images of an aligned array of SWNTs grown on quartz wafers by using $FeCl_3$/PVP as catalytic precursors and PDMS μCP technique to pattern the catalysts lines, along with corresponding Raman spectra chart and AFM image.

FIG. 4 shows the results of SWNTs 112 growth on quartz wafers 110 when one of ordinary skill uses FeCl$_3$/PVP as catalytic precursors and PDMS μCP technique to pattern the catalysts lines 109. The concentration of FeCl$_3$ may be 10 mM and the concentration of monomer of PVP may be 40 mM. As one of ordinary skill in the art may appreciate, and as depicted in SEM images (FIGS. 4a-c), the catalyst lines show that successful patterning may be fabricated on a large scale, and the aligned arrays of SWNTs 112 with a density of 2~5 SWNTs/μm may be synthesized. In local areas, the density may be up to 10 SWNTs/μm. Moreover, the Raman spectrum (FIG. 4e) has a typical RBM peak of SWNTs at 138.1 cm$^{-1}$, proving that SWNTs 112 may be obtained. Compared with the alternative embodiment where arrays of SWNTs 112 used SHIPLEY 1827 photoresist, the density here may be relatively lower and not very uniform. This latter characteristic is readily illustrated in AFM image (FIG. 4f).

Figure 5:
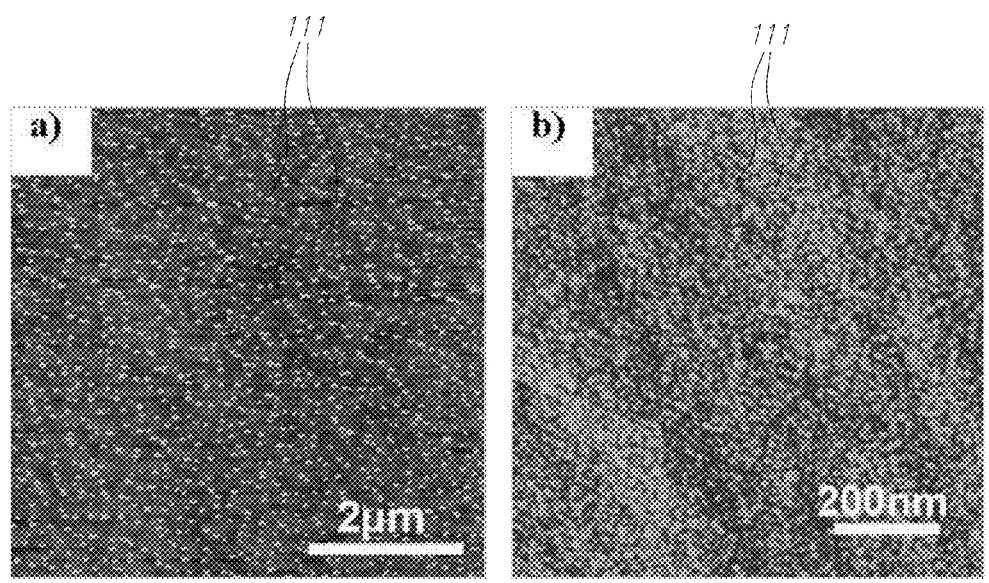
FIG. 5a-b is a series of AFM images of catalyst nanoparticles formed by heating quartz wafers that were patterned by using $FeCl_3$/Shipley 1827 and $FeCl_3$/PVP photoresist.

FIG. 5a-b is a series of AFM images of catalyst nanoparticles 111 formed by heating quartz wafers 110 that were patterned by using FeCl$_3$/SHIPLEY 1827 108 and FeCl$_3$/PVP photoresist (not shown). As one of ordinary skill may already be aware, the formation of mono-dispersed catalyst nanoparticles 111 is the foundation of catalyzing the CVD growth of SWNTs 112. FIG. 5a-b show uniform catalyst nanoparticles formed on substrates after heating wafers at 700° C. in air for 5 minutes. The average diameters of nanoparticles 111 may be approximately 6 nm when SHIPLEY 1827 photoresist 108 is used as a polymer layer (FIG. 5a). When PVP with 40 mM concentration of monomer is applied, however, the diameters of most nanoparticles may be less than 1 nm and the density of nanoparticles may be higher than the former case.

In the alternative embodiments described herein, the two kinds of polymers disclosed can generally be characterized as providing three functions. First, ordered structures of catalysts may be easily and reproducibly patterned on quartz wafers 110 by photolithography or PDMS stamp μCP techniques. Otherwise, FeCl$_3$ as the catalytic precursor may prove difficult to uniformly pattern on the surface of wafers 110. Other catalysts such as ferritin, FeMo cluster and Fe/Mo nanoparticles also may not be directly patterned on a wafer surface. As herein disclosed, a method of directly doping FeCl$_3$ into photoresist is relatively easy to perform on a large scale.

Second, a polymer layer may effectively prevent the formation of big particles during the drying and heating steps. This is especially so for μCP process Fe$_x$O$_y$ particles from the hydrolysis of FeCl$_3$.6H$_2$O since they may easily gather to be a bulk size on the surface of PDMS stamp when the ink solution dries in air. In addition, a polymer layer can help substrates anchor the catalyst nanoparticles 111. There may still be a small amount of polymer left on substrates when SWNTs begin to grow from catalyst lines. When there is a complete absence of PVP, big aggregative particles may form on the surface and many curved or random tubes may be observed. With an increase of the concentration of PVP, the number of curved or random tubes may gradually decrease, and the catalyst lines may be more obvious after the growth of SWNTs and the arrays may be more aligned. Too high concentration of PVP, however, may cause a lot of amorphous carbon and then poison the catalyst nanoparticles during the CVD process 106. Therefore, when 40 mM PVP is used, the density of arrays may start to lower. The results tend to show that the polymer layer can hold catalyst particles on substrates during the growth of SWNTs 112.

Figure 6:
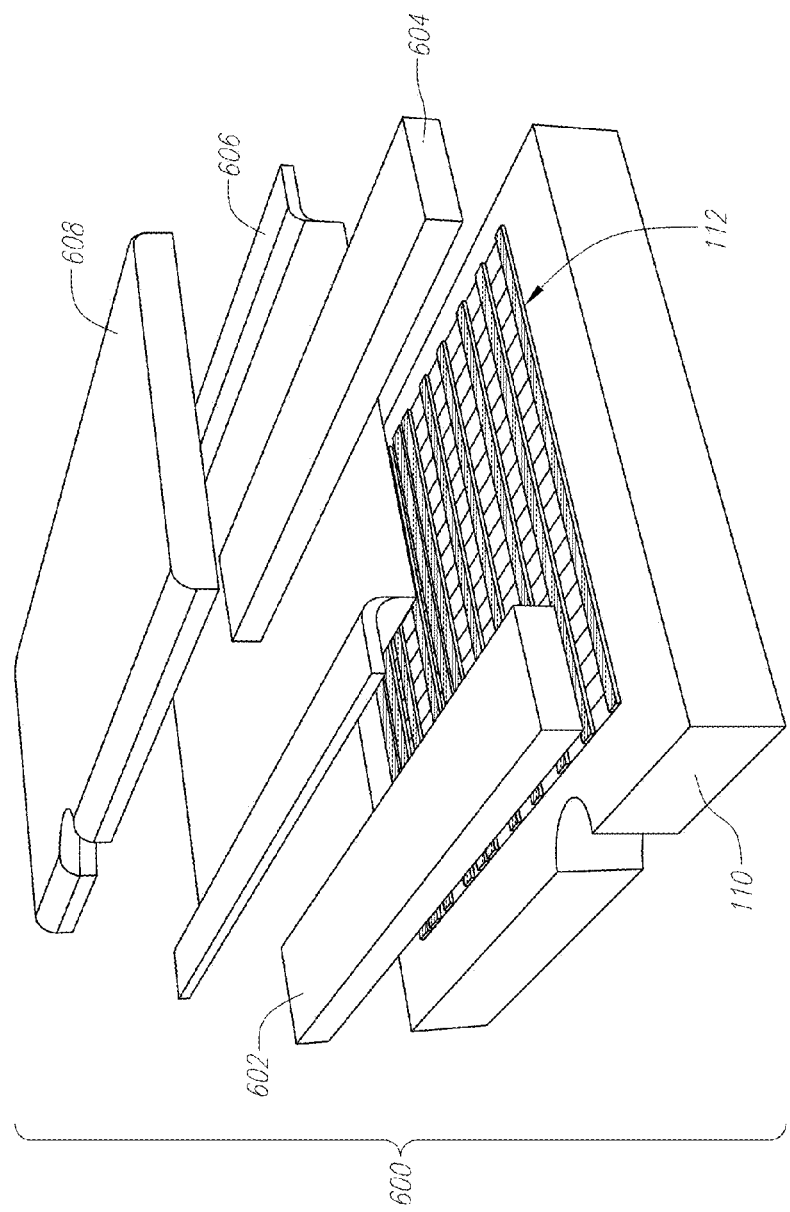
FIG. 6 illustrates a patterned, dense, high-quality SWNTs array as it would be incorporated into a field effect transistor.

FIG. 6 illustrates a patterned, dense, high-quality SWNTs array 112 as it would be incorporated into a field effect transistor 700. Although the very adoption of an SWNTs array 112 into electronics circuits may present a challenge in and of itself, the consistent and scalable fabrication process disclosed herein may help overcome some of the hurdles that have prevented increased use in electronics. As shown in FIG. 6, a field effect transistor (FET) 600 may be comprised of a quartz wafer 110, an array of SWNTs 112, a source 602, a drain 604, a dielectric 606 and a gate 608. One of ordinary skill could readily appreciate that the layout depicted in FIG. 6 would be faulty or imperfect but for the integrity of the dense, high-quality SWNTs array 112.

Figure 7:
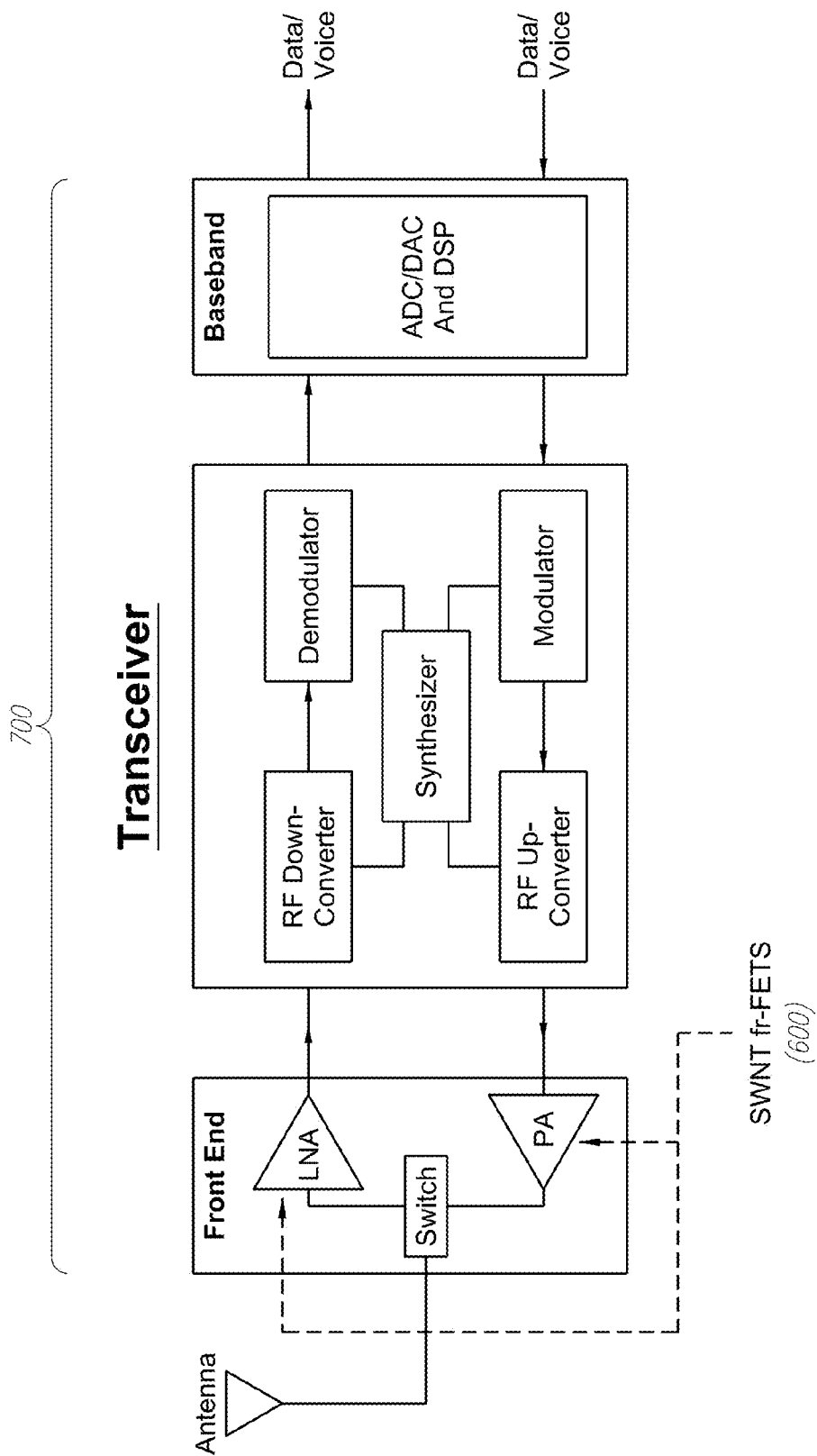
FIG. 7 is a block diagram illustrating how an SWNT rf-FET may be used in a transceiver.

FIG. 7 is a block diagram illustrating how an SWNT rf-FET 600 may be used in a transceiver 700. It is precisely due to the consistent and reliable fabrication process herein disclosed that would allow one of ordinary skill to implement SWNTs 112 into a high speed analog electronics circuit, as exemplified in transceiver 700. It is envisioned that significantly more complex functionality may be achieved by interconnecting SWNT-based transistors in a grand scale, nonetheless, the straightforward downscaling of the type of exemplary device set forth herein will allow for such future improvements.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents, and alternatives falling within the spirit and scope of the appended claims.

What is claimed:

1. A method for forming a uniform array of single-walled carbon nanotubes (SWNTs) comprising the steps of:
    forming a layer of photoresist on a substrate, the photoresist comprising catalyst particles of FeCl$_3$;
    patterning the photoresist into lines on said substrate using photolithography;
    treating said substrate with O$_2$ plasma to remove the lines of photoresist and expose lines of catalytic precursor nanoparticles; and
    exposing said substrate to a chemical vapor deposition (CVD) process to grow said array of SWNTs in a wafer's scale.

2. The method of claim 1 wherein said treating step is performed with calcination at 700° C.

3. The method of claim 2 wherein the step of exposing said substrate to a CVD process includes the steps of:
heating the substrate to greater than 700° C.;
reducing the catalyst by a flow of mixed gases of $H_2/Ar$; and
introducing a flow of methane and $H_2$.

4. The method of claim 3 wherein said substrate is one selected from the group consisting of a quartz wafer, a silicon wafer, and a sapphire wafer.

5. A method for forming an electronics component comprising an array of single-walled carbon nanotubes (SWNTs), the method comprising the steps of:
forming a layer of polyvinylpyrrolidine (PVP) on a substrate, the PVP comprising catalyst particles of $FeCl_3$;
patterning the PVP into lines on said substrate using photolithography;
treating said substrate with $O_2$ plasma to remove the lines of photoresist and expose lines of catalytic precursor nanoparticles; and
exposing said substrate to a chemical vapor deposition (CVD) process to grow said array of SWNTs in a wafer's scale,
wherein said array of SWNTs are parallel aligned at a density of at least 3 to 10 SWNTs per micrometer per unit length.

6. The method of claim 5 wherein 95% or more of said plurality of SWNTs have a parallel patterned alignment.

7. The method of claim 5 wherein said plurality of SWNTs has an average diameter of 1.1 nanometer.

8. The method of claim 5 wherein 95% or more of said plurality of SWNTs has a diameter between 0.7 nm and 1.7 nm.

9. The method of claim 5 further comprising incorporating said electronics component into an integrated circuit.

10. The method of claim 5 further comprising incorporating said electronics component into an rf-FET.

11. The method of claim 5 wherein said treating step is performed with calcination at 700° C.

12. The method of claim 11 wherein the step of exposing said substrate to a CVD process includes the steps of:
heating the substrate to greater than 700° C.;
reducing said catalyst by a flow of mixed gases of $H_2/Ar$; and
introducing a flow of methane and $H_2$.

13. A method for forming a uniform array of single-walled carbon nanotubes (SWNTs) comprising the steps of:
forming a layer of polyvinylpyrrolidine (PVP) on a substrate, the PVP comprising catalyst particles of $FeCl_3$;
patterning the PVP into lines on said substrate; and
exposing said substrate to a chemical vapor deposition (CVD) process to grow said array of SWNTs in a wafer's scale;
wherein the patterning comprises
dipping an ink onto the surface of a polydimenthylsiloxane (PDMS) stamp;
applying said stamp to the surface of the substrate to microcontact print (μCP) a pattern comprising a plurality of catalyst columns on the substrate, wherein said plurality of catalyst columns is doped with a plurality of catalytic precursor nanoparticles; and
treating said plurality of catalyst columns to remove excess material and expose said plurality of catalytic precursor nanoparticles.

* * * * *